US012721176B2

(12) United States Patent
Hsiao et al.

(10) Patent No.: US 12,721,176 B2
(45) Date of Patent: Aug. 25, 2026

(54) SEMICONDUCTOR DEVICE AND METHODS OF MANUFACTURE

(71) Applicant: Taiwan Semiconductor Manufacturing Co., Ltd., Hsinchu (TW)

(72) Inventors: Min-Chien Hsiao, Taichung City (TW); Chao-Wen Shih, Zhubei City (TW); Kuo-Chiang Ting, Hsinchu (TW); Yen-Ming Chen, Chu-Pei City (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 435 days.

(21) Appl. No.: 18/450,603

(22) Filed: Aug. 16, 2023

(65) Prior Publication Data

US 2025/0062259 A1 Feb. 20, 2025

(51) Int. Cl.

| | |
|---|---|
| ***H01L 23/00*** | (2006.01) |
| ***H01L 25/065*** | (2023.01) |
| ***H10W 42/00*** | (2026.01) |
| ***H10W 90/00*** | (2026.01) |
| *H10W 80/00* | (2026.01) |

(52) U.S. Cl.

CPC ......... *H10W 42/121* (2026.01); *H10W 90/00* (2026.01); *H10W 80/312* (2026.01); *H10W 80/327* (2026.01); *H10W 90/792* (2026.01)

(58) Field of Classification Search

CPC ....... H01L 24/08; H01L 23/562; H01L 24/80; H01L 25/0655; H01L 2224/08145; H01L 2224/80895; H01L 2224/80896; H01L 25/50

USPC .......................................................... 257/777

See application file for complete search history.

(56) References Cited

U.S. PATENT DOCUMENTS

| | | | |
|---|---|---|---|
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 11,869,859 B2 | 1/2024 | Chang | |
| 2017/0117253 A1* | 4/2017 | Yu | H01L 24/25 |
| 2020/0057177 A1* | 2/2020 | Hart | G02B 1/115 |
| 2020/0161263 A1* | 5/2020 | Chen | H03K 19/1776 |
| 2022/0223553 A1 | 7/2022 | Chen et al. | |
| 2023/0154863 A1 | 5/2023 | Wu et al. | |

FOREIGN PATENT DOCUMENTS

| | | |
|---|---|---|
| TW | 202322324 A | 6/2023 |

* cited by examiner

*Primary Examiner* — Tong-Ho Kim

(74) *Attorney, Agent, or Firm* — Slater Matsil, LLP

(57) ABSTRACT

A semiconductor device and methods of manufacture are discussed herein. A device includes a first semiconductor package including a first semiconductor die encapsulated in an insulating material, a first thermal expansion resistant layer over the first semiconductor die, a bonding layer over the first thermal expansion resistant layer and the insulating material, and a second semiconductor die directly bonded to the bonding layer.

20 Claims, 20 Drawing Sheets

SEMICONDUCTOR DEVICE AND METHODS OF MANUFACTURE

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (POP) technology. In a POP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
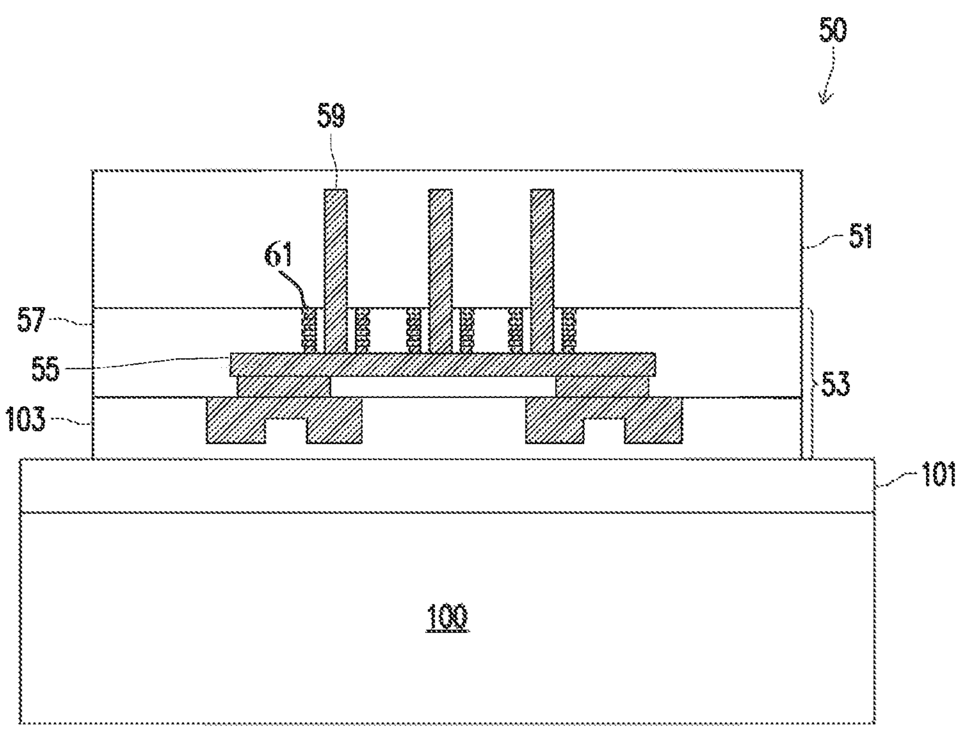
FIGS. 1-10 illustrate various views of steps in forming a first POP device having an oxide liner surrounding a thermal expansion resistant layer over a top surface of a bottom semiconductor die in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a layer of thermal expansion resistant material is deposited at bonding boundary points within the semiconductor package device. The layer of thermal expansion resistant material helps alleviate the strain caused between the thermal mismatch between materials within the semiconductor package device (e.g., the thermal expansion between a gapfill oxide with a coefficient of thermal expansion (CTE) of 0.6 and a silicon bottom die with a CTE of 2.8). The difference in CTE between such materials may result in punch up of the material with a higher CTE (e.g., silicon punch up) which may result in delamination at the boundary layer. The addition of a thermal expansion resistant material which has an adequate hardness helps suppress this punch up and reduce the risk of delamination.

FIG. 1 illustrates a cross-sectional view of one or more first integrated circuit dies 50 bonded to a first bonding layer 101 of a first carrier substrate 100 in accordance with some embodiments. In accordance with some embodiments, the first carrier substrate 100 comprises silicon, or the like. The first bonding layer 101 may comprise an oxide, such as silicon oxide, silicon oxynitride, the like, or a combination thereof, and may be formed by high density plasma chemical vapor deposition (HDP-CVD), a flowable CVD (FCVD) (e.g., a CVD-based material deposition in a remote plasma system and post curing to make it convert to the oxide), atomic layer deposition, (ALD), physical vapor deposition (PVD), the like, or a combination thereof. Other oxide materials formed by any acceptable process may be used to form the first bonding layer 101 over the first carrier substrate 100.

In accordance with some embodiments, the first integrated circuit die 50 may be a bare chip semiconductor die (e.g., an unpackaged semiconductor die). For example, the first integrated circuit die 50 may be a logic die (e.g., AP, central processing unit, microcontroller, etc.), a memory die (e.g., DRAM die, HBC, SRAM die, wideIO memory die, mRAM die, rRAM) die, etc.), a power management die (e.g., PMIC dies), a RF die, a sensor die, a MEMS die, a signal processing die (e.g., DSP die), a front-end die (e.g., AFE die), a biomedical die, or the like.

The first integrated circuit die 50 may be processed according to applicable manufacturing processes to form integrated circuits in the first integrated circuit die 50. For example, the first integrated circuit die 50 may each include a first semiconductor substrate 51, such as silicon, doped or undoped, or an active layer of a semiconductor-on-insulator (SOI) substrate. The first semiconductor substrate 51 may include other semiconductor materials, such as germanium;

a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Devices, such as transistors, diodes, capacitors, resistors, or the like, may be formed in and/or on the first semiconductor substrate 51 and may be interconnected by a first interconnect structure 53, which comprises first metallization patterns 55 (e.g., conductive lines, vias, and conductive pads) in one or more first interconnect dielectric layers 57 to form one or more integrated circuits. The first interconnect dielectric layers 57 may comprise silicon oxide, silicon nitride, silicon oxynitride, a polymer, or the like and be deposited by PVD, CVD, ALD, or the like. The first metallization patterns 55 may be conductive features formed in the first interconnect dielectric layers 57 by damascene processes, for example.

Additionally, the first integrated circuit die 50 may include one or more through silicon vias (TSVs) 59 that extend into the first semiconductor substrate 51 of the first integrated circuit die 50 so as to provide a quick passage of data signals. In an embodiment the TSVs 59 may be formed by initially forming TSV openings into the first semiconductor substrate 51 (e.g., prior to formation of the active devices). The TSV openings may be formed by applying and developing a suitable photoresist (not shown), and removing portions of the first semiconductor substrate 51 that are exposed to the desired depth. The TSV openings may be formed so as to extend into the first semiconductor substrate 51 at least further than the active devices formed within and/or on the first semiconductor substrate 51, and may extend to a depth greater than the eventual desired height of the first semiconductor substrate 51. Once the TSV openings have been formed within the first semiconductor substrate 51, the TSV openings may be lined with a liner. The liner may be, e.g., an oxide formed from tetraethylorthosilicate (TEOS) or silicon nitride, although any suitable dielectric material may alternatively be used. The liner may be formed using a plasma enhanced chemical vapor deposition (PECVD) process, although other suitable processes, such as physical vapor deposition or a thermal process, may alternatively be used.

Once the liner has been formed along the sidewalls and bottom of the TSV openings, a barrier layer (also not independently illustrated) may be formed and the remainder of the TSV openings may be filled with first conductive material. The first conductive material may comprise copper, although other suitable materials such as aluminum, alloys, doped polysilicon, combinations thereof, and the like, may alternatively be utilized. The first conductive material may be formed by electroplating copper onto a seed layer (not shown), filling and overfilling the TSV openings. Once the TSV openings have been filled, excess liner, barrier layer, seed layer, and first conductive material outside of the TSV openings may be removed through a planarization process such as chemical mechanical polishing (CMP), although any suitable removal process may be used. Further, in an embodiment, guard ring structures 61 may be formed in the one or more first interconnect dielectric layers 57, the guard ring structures 61 surrounding each one of the one or more TSVs 59. The guard ring structures 61 may have multiple functions, such as, isolation, stress relief, current leakage prevention, electrostatic discharge (ESD) protection, the like, or a combination thereof. For example, to help prevent current leakage protection, the guard ring structures 61 may be grounded to help prevent or reduce electrical interference resulting from a current being carried through the one or more TSVs 59.

In accordance with some embodiments, a second bonding layer 103 may be deposited over what may be referred to as an active side or front side of the first integrated circuit die 50. The active side/front side of the first integrated circuit die 50 may refer to a side of the first semiconductor substrate 51 on which the active devices are formed. The back side of the first integrated circuit die 50 may refer to a side of the first semiconductor substrate 51 opposite the active side/front side. In some embodiments, the second bonding layer 103 may be an oxide, such as silicon oxide, silicon oxynitride, the like, or a combination thereof, and may be formed by HDP-CVD, FCVD, CVD, ALD, PVD, the like, or a combination thereof. Other oxide materials formed by any acceptable process may be used to forming the second bonding layer 103 over the first integrated circuit die 50.

In an embodiment, the one or more first integrated circuit dies 50 may be bonded to the first carrier substrate 100 through a first dielectric-to-dielectric bonding process (e.g., oxide-to-oxide bonding) forming a first dielectric-to dielectric bond (e.g., an oxide-to-oxide bond). The first dielectric-to-dielectric bond may be initiated by activating the first bonding layer 101 and/or the second bonding layer 103 followed by applying pressure, heat and/or other bonding process steps to join the first bonding layer 101 to the second bonding layer 103 surfaces. The activating the first bonding layer 101 and the second bonding layer 103 may be performed using, e.g., a dry treatment, a wet treatment, a plasma treatment, exposure to $H_2$, exposure to $N_2$, exposure to $O_2$, combinations of these, or the like. In embodiments where a wet treatment is used, an RCA cleaning process may be used, for example. The activating assists in the first dielectric-to-dielectric bonding of the first bonding layer 101 and the second bonding layer 103 by, e.g., allowing the use of lower pressures and temperatures in subsequent first dielectric-to-dielectric bonding processes. Through the treatment, the number of OH groups at surface(s) of the first bonding layer 101 and/or the second bonding layer 103 increases. After surfaces of the first bonding layer 101 and/or the second bonding layer 103 are activated, the first bonding layer 101 and the second bonding layer 103 may be contacted together at a relatively low temperature (e.g., room temperature) to form weak bonds. Subsequently, an annealing is performed to strengthen the weak bonds and form a first dielectric-to-dielectric bond. During the annealing, the H of the OH bonds is outgassed, thereby forming Si—O—Si bonds between the first bonding layer 101 and the second bonding layer 103, thereby strengthening the bonds.

Figure 2:
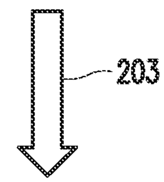
Figure 2:
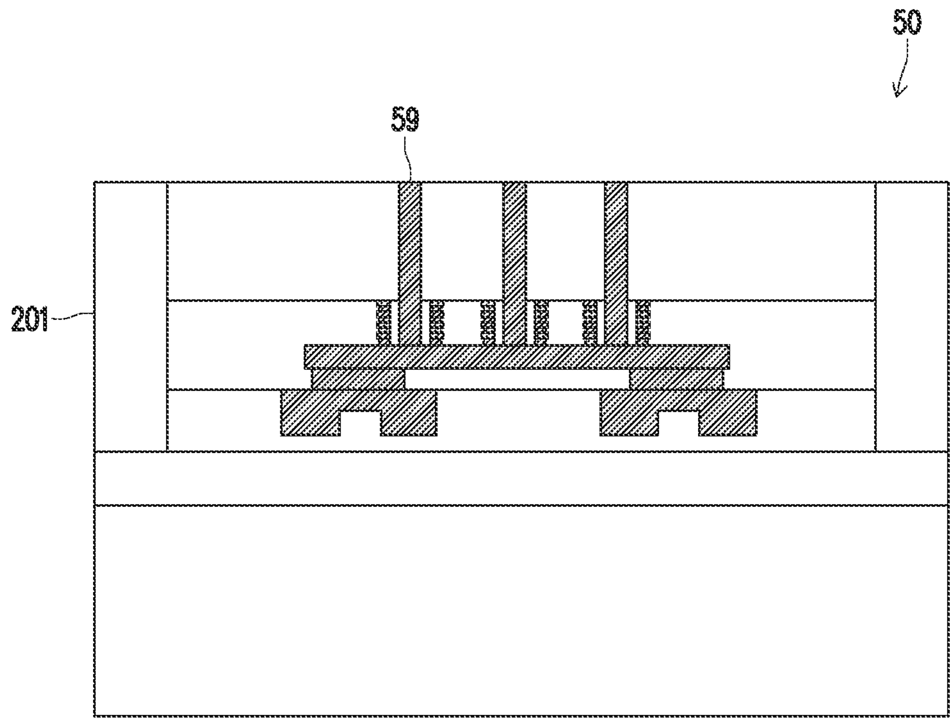

FIG. 2 illustrates a cross-sectional view of a first insulating material 201 (also referred to as a gapfill material or an encapsulant) encapsulating the first integrated circuit die 50. In accordance with some embodiments, the first insulating material 201 may be an oxide such as silicon oxide (e.g., silicon dioxide), or the like. The first insulating material 201 may be formed by spin-coating, HDPCVD, or the like. In some embodiments the first insulating material 201 is formed to over fill the one or more first integrated circuits 50 and fill any gaps in between the one or more first integrated circuits 50. In an embodiment, a first planarization process 203 may be performed to remove excess material of the first insulating material 201 over the first integrated circuit die 50. Further, in an embodiment the first planarization process 203 may remove a portion of the first semiconductor substrate 51 revealing the TSVs 59 and form a planar top surface (within process variations) shared between the first insulating material 201 and the first integrated circuit die 50. The first planarization process 203 may be a grinding process, a chemical mechanical polish (CMP) process, or the like. However, any suitable planarization process may be utilized.

Figure 3:
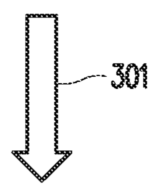
Figure 3:
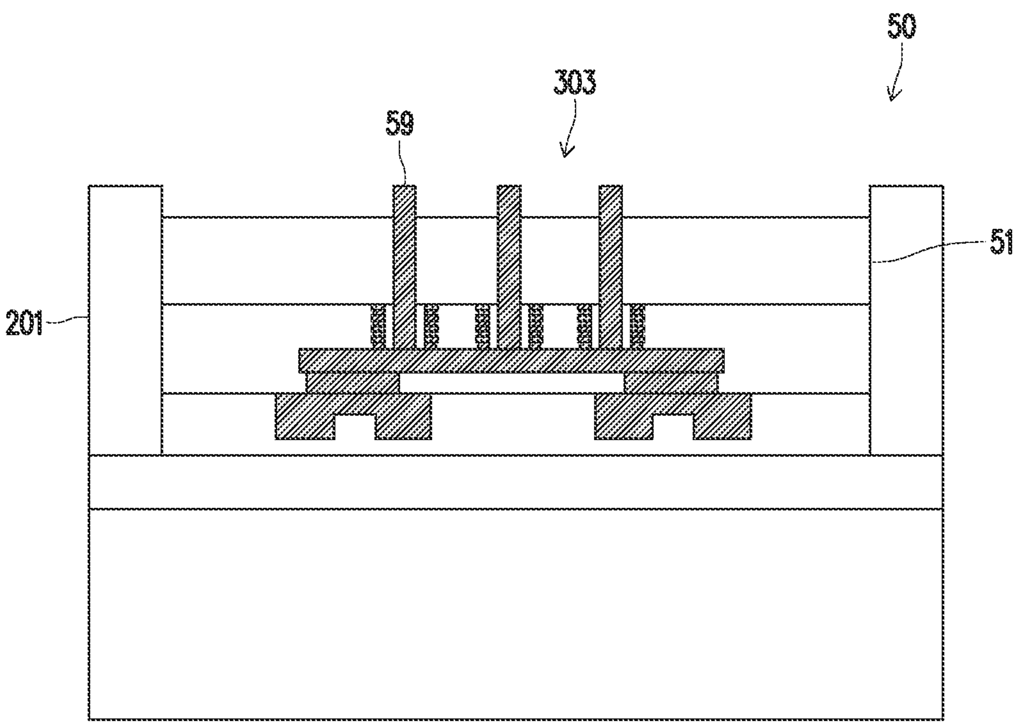

FIG. 3 illustrates a cross-sectional view of an etching process 301 performed on the first semiconductor substrate 51 to form recesses 303 in the first semiconductor substrate 51 between the TSVs 59. In an embodiment, the etching process 301 may be any acceptable etch process, such as a reactive ion etch (RIE), neutral beam etch (NBE), the like, or a combination thereof. The etching may be anisotropic. In one embodiment, the etching process 301 is a time-controlled anisotropic plasma etch process that creates the recesses 303. In an embodiment, the recesses may be formed to a sufficient depth as to facilitate the thickness of a subsequently formed thermal expansion resistant layer in the recesses 303.

Figure 4:
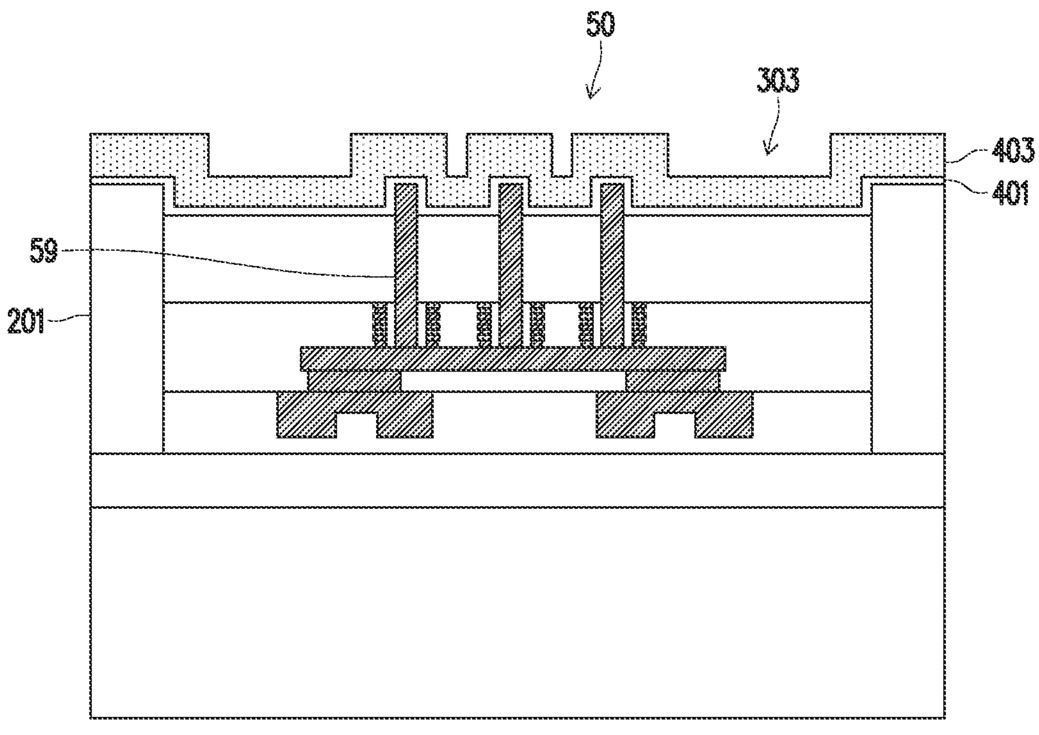

FIG. 4 illustrates a cross-sectional view of an oxide material 401 over a top surface of the first insulting layer 201, in the recesses 303 and over exposed portions of the TSVs 59 and a thermal expansion resistant material 403 over the oxide material. In an embodiment, the oxide material 401 may be deposited by a conformal deposition process, such as by Atomic Layer Deposition (ALD), High-Density Plasma Chemical Vapor Deposition (HDPCVD), Chemical Vapor Deposition (CVD), or the like. In an embodiment, the oxide material 401 may be a silicon oxide, or the like. In an embodiment, the thermal expansion resistant material 403 may be deposited by a conformal deposition process, such as by ALD, HDPCVD, CVD, or the like. In an embodiment, the thermal expansion resistant material 403 may be a silicon nitride, such as SiN, SiCN, SiON, or the like. The thermal expansion resistant material 403 may have a first hardness in a range of 10 GPa to 30 GPa. The hardness of the thermal expansion resistant material 403 facilitates the suppression of thermal expansion mismatch beneath the thermal expansion resistant material 403 reducing the risk of delamination between the first integrated circuit die 50 and subsequently bonded structures. If the hardness of the thermal expansion resistant material 403 is less than the first hardness, than the thermal expansion resistant material 403 may not be able to adequately suppress thermal mismatch between bonded layers. If the hardness of the thermal expansion resistant material 403 is greater than the first hardness than the thermal expansion resistant material 403 may be too hard for subsequent processing.

Figure 5:
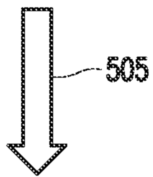
Figure 5:
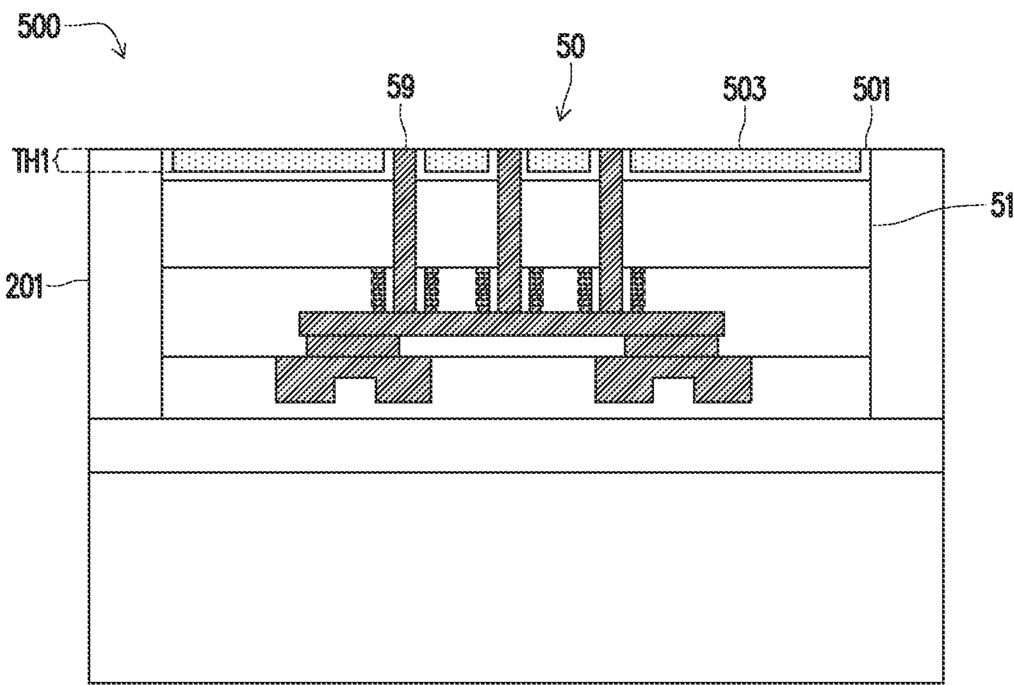

FIG. 5 illustrates a cross-sectional view of an oxide liner 501 around a thermal expansion resistant layer 503 following a planarization process 505. In an embodiment, following the deposition of the oxide material 401 and the deposition of the thermal expansion resistant material 403 a planarization process 505 is performed to remove excess material of the oxide material 401 and of the thermal expansion resistant material 403 from above the first insulating material 201 and from above the TSVs 59 exposing the TSVs 59. In an embodiment, following the planarization process 505, the thermal expansion resistant layer 503 isolates the first semiconductor substrate 51 of the first integrated circuit die 50 from subsequently formed structures over the first integrated circuit die 50, the first integrated circuit die 50 being encapsulated by the first insulating material 201. In this embodiment, the first insulating material 201, the oxide liner 501 (if present), the thermal expansion resistant layer 503, and the TSVs 59 of the first integrated circuit die 50 share a planar top surface (within process variations). The first insulating material 201, the thermal expansion resistant layer 503, and the first integrated circuit die 50 following the planarization process 505 may be referred to as a first package device 500, the first package device 500 having the planar top surface.

Following the planarization process 505, the thermal expansion resistant layer 503 may have a first thickness TH1, the first thickness being in a range from 500 Å to 10,000 Å. If the thickness of the thermal expansion resistant layer 503 is less than the first thickness TH1, than the thermal expansion resistant layer 503 may provide adequate rigidity to suppress thermal expansion mismatch from beneath the thermal expansion resistant layer 503 increasing the risk of delamination. If the thickness of the thermal expansion resistant layer 503 is greater than the first thickness TH1 than the overall resulting structure may be too rigid and increase the risk of corner cracking at interfaces at the thermal expansion resistant layer 503.

Figure 6:
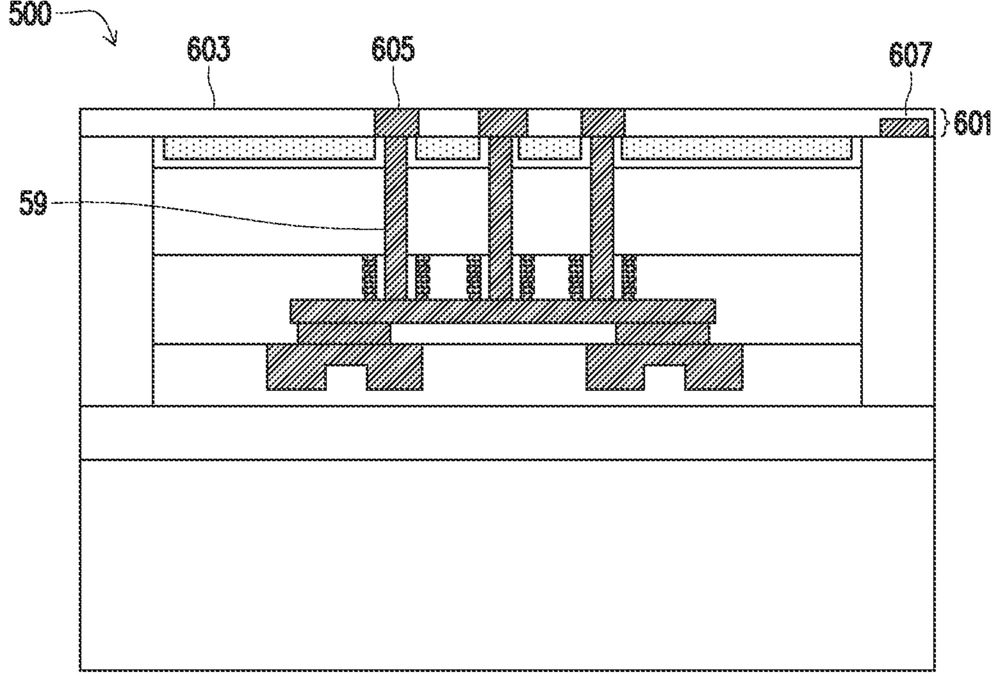

FIG. 6 illustrates a cross-sectional view of a third bonding layer 601 formed over the planar top surface of the first package device 500. In an embodiment, the third bonding layer 601 may comprise a first dielectric layer 603 and first bond pads 605 embedded within the first dielectric layer 603. In some embodiments, the first bond pads 605 may comprise a conductive material such as copper, or the like. Some of the first bond pads 605 may be physically and electrically coupled to the TSVs 59. In an embodiment, the first dielectric layer 603 may comprise a silicon-containing dielectric material such as silicon oxide, silicon nitride, silicon oxynitride, or the like, and the first dielectric layer 603 may be deposited using a suitable deposition process such as CVD, PVD, ALD, HDPCVD, combinations of these, or the like. The first bond pads 605 may be formed within the first dielectric layer 603 or formed prior to the first dielectric layer 603 using any suitable process, such as a damascene process, electroplating, or the like.

For example, in an embodiment in which the first dielectric layer 603 is formed prior to the formation of the first bond pads 605, openings corresponding to the location of the first bond pads 605 may be formed in the first dielectric layer 603 using a combination of photolithography and etching processes. Once the openings have been formed within the first dielectric layer 603, the openings may be filled with a seed layer (not separately illustrated) and a plate metal to form the first bond pads 605 within the first dielectric layer 603. The seed layer may be blanket deposited over top surfaces of the first dielectric layer 603 and the exposed conductive portions of the underlying layers and sidewalls of the openings. The seed layer may comprise a copper layer. The seed layer may be deposited using processes such as sputtering, evaporation, or plasma-enhanced chemical vapor deposition (PECVD), or the like, depending upon the desired materials. The plate metal may be deposited over the seed layer through a plating process such as electrical or electro-less plating. The plate metal may comprise copper, a copper alloy, or the like.

As another example, in an embodiment in which the first dielectric layer 603 is formed after the formation of the first bond pads 605, a seed layer may be blanket deposited over the planar surface of the first package device 500. A photoresist (not separately illustrated) may be formed and patterned to define a layout of the first bond pads 605, and a plating process may be applied to form a plate metal in the openings of the photoresist. Subsequently, the photoresist and portions of the seed layer not covered by the plate metal may be removed, with remaining portions of the seed layer and the plate metal forming the first bond pads 605. The first dielectric layer 603 is then deposited around the first bond pads 605.

Optionally, a planarization step may then be performed to level a top surface of the third bonding layer 601 and the first bond pads 605 such that the third bonding layer 601 has a high degree of planarity with the first bond pads 605 (within process variations). Other materials and formation methods are also possible.

Further, in some embodiments, a first alignment structure 607 (also referred to as an alignment mark) may be formed in the first dielectric layer 603. In an embodiment, the first alignment structure 607 may be formed in a similar manner and from similar materials as the first bond pads 605. However, any suitable material or method may be utilized for forming the first alignment structure 607. The first alignment structure 607 may be utilized for the alignment of subsequently bonded structures over the first package device 500.

Figure 7:
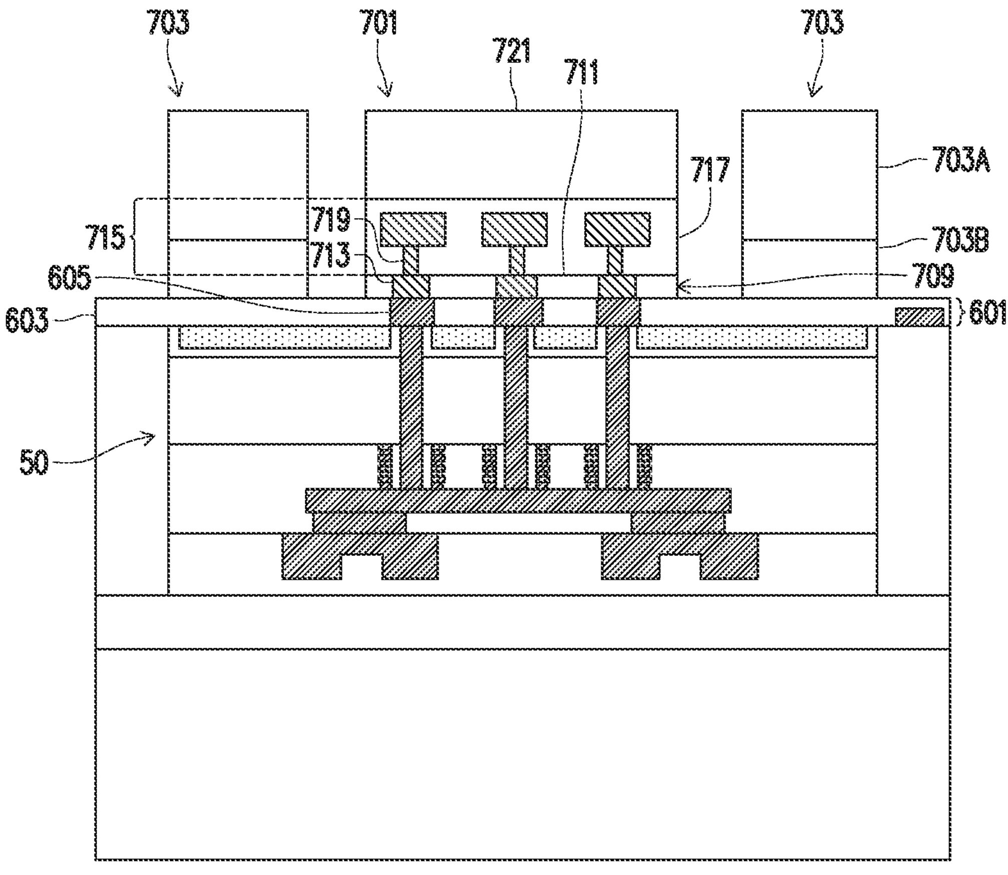

FIG. 7 illustrates a cross-sectional view of one or more second integrated circuit dies 701 and one or more dummy dies 703 attached to the first package device 500 by the third bonding layer 601. In accordance with some embodiments, the dummy dies 703 may be placed to provide structural support to a subsequently formed second package device 800 (see FIG. 8) and reduce warping or cracking, particularly when multiple integrated circuit dies are attached to the third bonding layer 601. The dummy dies 703 may be formed of a material that has a suitable mechanical stiffness or rigidity. In some embodiments, the dummy dies 703 may be formed from a semiconductor material such as silicon, silicon carbide, gallium arsenide, gallium phosphide, indium phosphide, indium arsenide, indium antimonide, the like, or combinations thereof. In some embodiments, the dummy dies 703 may be formed from a dielectric material such as a ceramic material, quartz, another electrically inert material, the like, or combinations thereof. In some embodiments, the dummy dies 703 may be a metal or metal alloy, such as a tin-nickel alloy (e.g., “Alloy 42”) or the like. In some embodiments, the dummy dies 703 are formed from two or more different materials, such as multiple layers of different materials. In some embodiments, the material of the dummy dies 703 is chosen based on the mechanical stiffness or rigidity of the material.

In some embodiments, the dummy dies 703 are included for improved uniformity in the second package device 800, which may result in improved planarization. The dummy dies 703 may also be included to reduce CTE mismatch amongst various features in the second package device 800. The dummy dies 703 may also as act as a heat dissipation feature. In such embodiments, a material of the dummy dies 703 may be selected to have a relatively high thermal conductivity (e.g., higher than a thermal conductivity than subsequently deposited second insulating material 801, see FIG. 8). In accordance with some embodiments, the dummy dies 703 may be substantially free of any active devices, functional circuits, or the like. For example, the dummy dies 703 may include a dummy die substrate 703A (e.g., a bulk silicon substrate) and a dummy die bonding layer 703B. The dummy die bonding layer 703B may be used to bond the dummy dies 703 to the third bonding layer 601 using a fusion bonding process for example.

The second integrated circuit die 701 may be a bare chip semiconductor die (e.g., an unpackaged semiconductor die). For example, the second integrated circuit die 701 may be a logic die (e.g., AP, central processing unit, microcontroller, etc.), a memory die (e.g., DRAM die, HBC, SRAM die, wideIO memory die, mRAM die, rRAM) die, etc.), a power management die (e.g., PMIC dies), a RF die, a sensor die, a MEMS die, a signal processing die (e.g., DSP die), a front-end die (e.g., AFE die), a biomedical die, or the like.

The second integrated circuit die 701 may be processed according to applicable manufacturing processes to form integrated circuits in the second integrated circuit die 701. For example, the second integrated circuit die 701 may include a second semiconductor substrate 721, such as silicon, doped or undoped, or an active layer of a semiconductor-on-insulator (SOI) substrate. The second semiconductor substrate 721 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Devices, such as transistors, diodes, capacitors, resistors, or the like, may be formed in and/or on the second semiconductor substrate 721 and may be interconnected by the second interconnect structure 715, which comprises second metallization patterns 719 (e.g., conductive lines and vias) in one or more second interconnect dielectric layers 717 to form one or more integrated circuits. The second interconnect dielectric layers 717 may comprise silicon oxide, silicon nitride, silicon oxynitride, a polymer, or the like and be deposited by PVD, CVD, ALD, or the like. The second metallization patterns 719 may be conductive features formed in the second interconnect dielectric layers 717 by damascene processes, for example.

The second integrated circuit die 701 further comprises second contact pads 713, which allow external connections are made to the second interconnect structure 715 and the devices on the second semiconductor substrate 721. The second contact pads 713 may comprise copper, aluminum (e.g., 28K aluminum), or another conductive material that are electrically connected to the second metallization patterns 719 of the second interconnect structure 715. The second contact pads 713 are disposed on what may be referred to as an active side or front side of the second integrated circuit die 701. The active side/front side of the second integrated circuit die 701 may refer to a side of the second semiconductor substrate 721 on which the active devices are formed. The back side of the second integrated circuit die 701 may refer to a side of the second semiconductor substrate 721 opposite the active side/front side.

The second integrated circuit die 701 may be formed as part of a larger wafer (e.g., connected to other second integrated circuit dies 701). In some embodiments, the second integrated circuit die 701 may be singulated from each other prior to packaging. The singulation process may include mechanical sawing, laser dicing, plasma dicing, combinations thereof, or the like. In other embodiments, the second integrated circuit die 701 is singulated after they are integrated into a semiconductor package. For example, the second integrated circuit die 701 may be packaged while still connected as part of a wafer.

In accordance with some embodiments, the second integrated circuit die 701 is attached to the third bonding layer 601 by a fourth bonding layer 709. The second integrated circuit die 701 may be attached to the third bonding layer 601 concurrently, before, or after attaching the dummy dies 703 to the third bonding layer 601. The fourth bonding layer 709 may include a second dielectric layer 711 and the second contact pads 713. The second dielectric layer 711 may comprise a silicon-containing dielectric material such as silicon oxide, silicon nitride, silicon oxynitride, or the like and the second dielectric layer 711 may be deposited using a suitable deposition process such as CVD, PVD, ALD, HDPCVD, oxidation of the underlying material, combinations of these, or the like. The second contact pads 713 may be formed in a similar manner as the first bond pads 605. Optionally, a planarization step may then be performed to level a top surface of the fourth bonding layer 709 such that the fourth bonding layer 709 has a high degree of planarity (within process variations). Other materials and formation methods are also possible.

In some embodiments, the second integrated circuit die 701 is bonded to the third bonding layer 601 by a dielectric-to-dielectric and metal-to-metal bonding process performed between the third bonding layer 601 and the fourth bonding layer 709. In some embodiments, the dielectric-to-dielectric bonding process forms a direct bond (e.g. a fusion bond such as an oxide-to-oxide bond) between the first dielectric layer 603 and the second dielectric layer 711. Further, the metal-to-metal bonding process may directly bond the first bond pads 605 of the third bonding layer 601 to the second contact pads 713 of the second integrated circuit die 701 through direct metal-to-metal bonding. Thus, electrical connection between the first integrated circuit die 50 and the second integrated circuit die 701 may be provided by the physical connection of the first bond pads 605 to the second contact pads 713. The dielectric-to-dielectric bonding process may start with applying a surface treatment to either or both of the first dielectric layer 603 and the second dielectric layer 711 facilitating a dielectric-to-dielectric bond between the first dielectric layer 603 and the second dielectric layer 711 (e.g. a such as an oxide-to-oxide bond). The surface treatment may include a plasma treatment. The plasma treatment may be performed in a vacuum environment. After the plasma treatment, the surface treatment may further include a cleaning process (e.g., a rinse with deionized water, or the like) that may be applied to either or both of the first dielectric layer 603 and the second dielectric layer 711. The dielectric-to-dielectric and metal-to-metal bonding process may then proceed to aligning the second contact pads 713 of the second integrated circuit die 701 to the first bond pads 605 of the third bonding layer 601. Next, the dielectric-to-dielectric and metal-to-metal bonding process includes a pre-bonding step, during which the second integrated circuit die 701 is put in contact with the third bonding layer 601. The pre-bonding may be performed at room temperature (e.g., between about 21° C. and about 25° C.). The dielectric-to-dielectric and metal-to-metal bonding process continues with performing an anneal, for example, at a temperature between about 150° C. and about 400° C. for a duration between about 0.5 hours and about 3 hours, so that the first bond pads 605 (e.g., copper) and the second contact pads 713 (e.g., copper) inter-diffuses to each other, and hence the direct metal-to-metal bonding is formed.

Figure 8:
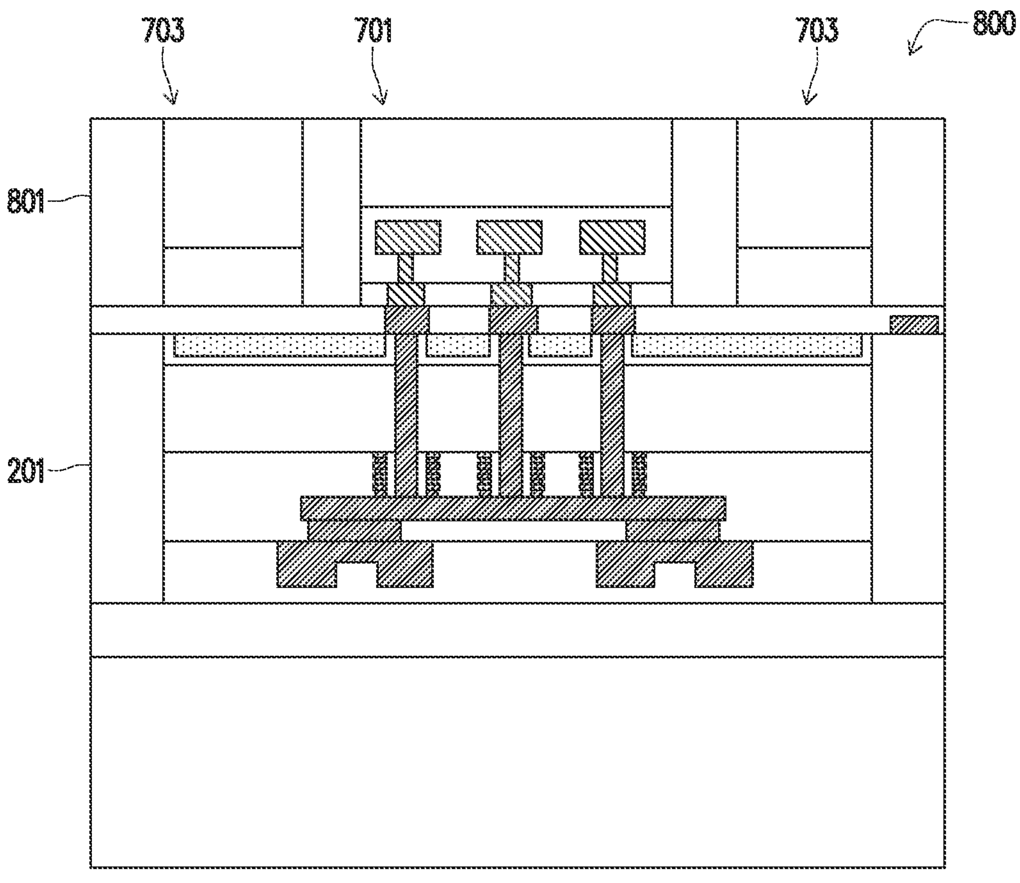

FIG. 8 illustrates a cross-sectional view of the one or more dummy dies 703 and the one or more second integrated circuit dies 701 encapsulated by a second insulating material 801. The second insulating material 801 may be deposited over the one or more dummy dies 703 and the second integrated circuit die 701 and in gaps between the one or more dummy dies 703 and the second integrated circuit die 701. The second insulating material 801 may be formed in a similar manner as the first insulating material 201. In some embodiments the second insulating material 801 may be thinned in a similar manner as the first insulating material 201 such that the one or more dummy dies 703, the second integrated circuit die 701, and the second insulating material 801 share a planar top surface (within process variations). The resulting structure of the one or more dummy dies 703, the second integrated circuit die 701, and the thinned second insulating material 801 may be referred to as a second package device 800. In this embodiment, the second package device 800 may have a planar surface (within process variations).

Figure 9:
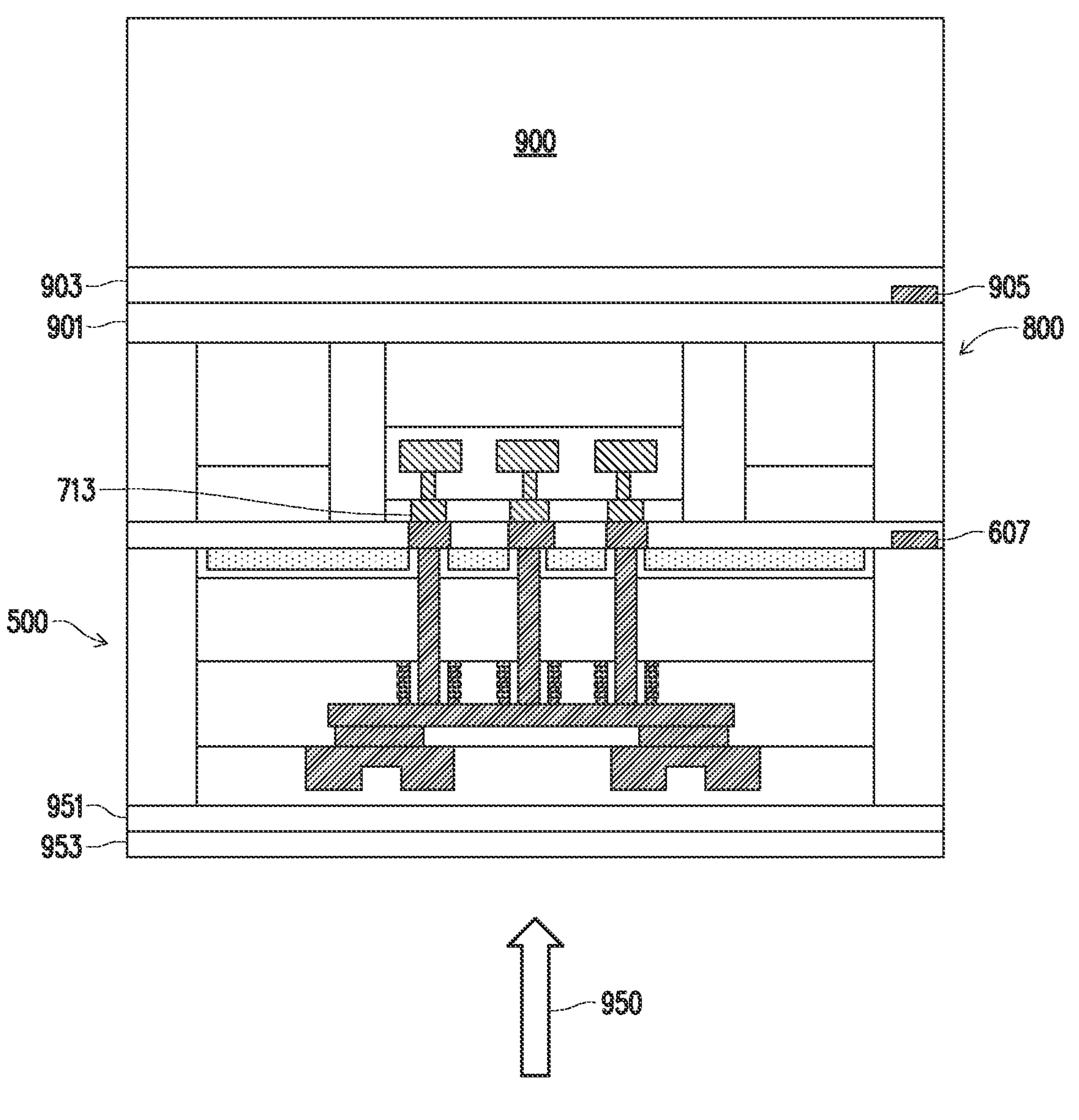

FIG. 9 illustrates a cross-sectional view of a removal of the first carrier substrate 100 and an attachment of a second carrier substrate 900. In an embodiment, a fifth bonding layer 901 may be formed over the planar surface of the second package device 800. In an embodiment, the fifth bonding layer 901 may comprise an oxide, such as silicon oxide, silicon oxynitride, the like, or a combination thereof, and may be formed by high density plasma chemical vapor deposition (HDP-CVD), a flowable CVD (FCVD) (e.g., a CVD-based material deposition in a remote plasma system and post curing to make it convert to the oxide), ALD, physical vapor deposition (PVD), the like, or a combination thereof. Other oxide materials formed by any acceptable process may be used to form the fifth bonding layer 901 over the second package device 800.

Following the formation of the fifth bonding layer 901, the second carrier substrate 900 may be bonded to the fifth bonding layer 901 by a sixth bonding layer 903 of the second carrier substrate 900. In an embodiment, the sixth bonding layer 903 is formed over the second carrier substrate 900 in a similar manner and from similar materials as the fifth bonding layer 901. In accordance with some embodiments, the second carrier substrate 900 comprises silicon, or the like. In an embodiment, the sixth bonding layer 903 is bonded to the fifth bonding layer 901 through a second dielectric-to-dielectric bonding process (e.g., oxide-to-oxide bonding) forming a second dielectric-to dielectric bond (e.g., an oxide-to-oxide bond). The second dielectric-to-dielectric bonding process may be carried out in a similar manner as the first dielectric-to-dielectric bonding process used to form the first dielectric-to-dielectric bond.

Further, in an embodiment, the sixth bonding layer 903 may comprise a second alignment structure 905 embedded within the sixth bonding layer 903 to facilitate the alignment of the second carrier substrate 900 to the second package device 800. The second alignment structure 905 may be formed in a similar manner and from similar materials as the first alignment structure 607.

FIG. 9 further illustrates the removal of the first carrier substrate 100. In an embodiment, the first carrier substrate 100, along with the first bonding layer 101, may be removed through a second planarization process 950. The second planarization process 950 may be a grinding process, a CMP process, or the like. However, any suitable planarization process may be utilized. Following the removal of the first carrier substrate 100, along with the first bonding layer 101, a third dielectric layer 951 may be formed over an exposed bottom surface of the first package device 500. In an embodiment, the third dielectric layer 951 may comprise silicon oxide, silicon nitride, silicon oxynitride, a polymer, or the like and be deposited by PVD, CVD, ALD, or the like. Additionally, in an embodiment, a first passivation film 953 may be formed over the third dielectric layer 951. The first passivation film 953 may comprise silicon oxide, silicon oxynitride, silicon nitride, or the like, and may be deposited by CVD, ALD, PVD, or the like.

Figure 10:
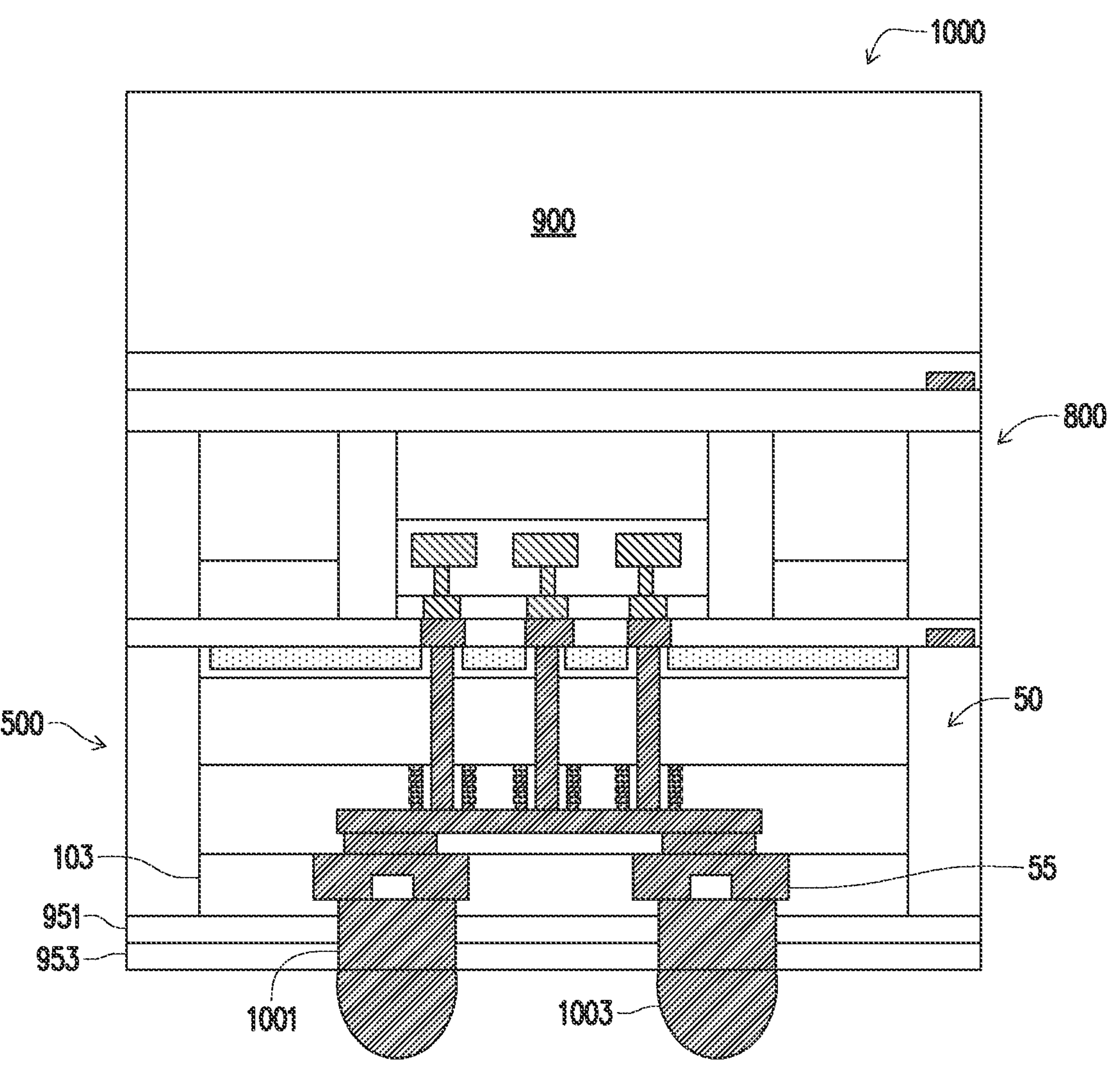

FIG. 10 illustrates a cross-sectional view of first die connectors 1001 formed in first openings (not separately illustrated) through the third dielectric layer 951 and the first passivation film 953, and conductive connectors 1003 are formed over the first die connectors 1001. In some embodiments, the first die connectors 1001 extend through the first passivation film 951, the third dielectric layer 951, and the second bonding layer 103 to physically and electrically couple to conductive pads of the first metallization patterns 55 of the first integrated circuit die 50. The first die connectors 1001 may be formed of the same material as the second contact pads 713. In an embodiment, the conductive connectors 1003 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 1003 may include a conductive material such as solder, copper, aluminum, gold, nickel, silver, palladium, tin, the like, or a combination thereof. In some embodiments, the conductive connectors 1003 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 1003 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

In accordance with some embodiments of the present disclosure, after forming the conductive connectors 1003 over the first die connectors 1001 a first POP device 1000 is formed. In an embodiment, the first POP device 1000 comprises the second carrier substrate 900 which supports the second package device 800 stacked over the first package device 500.

Figure 11:
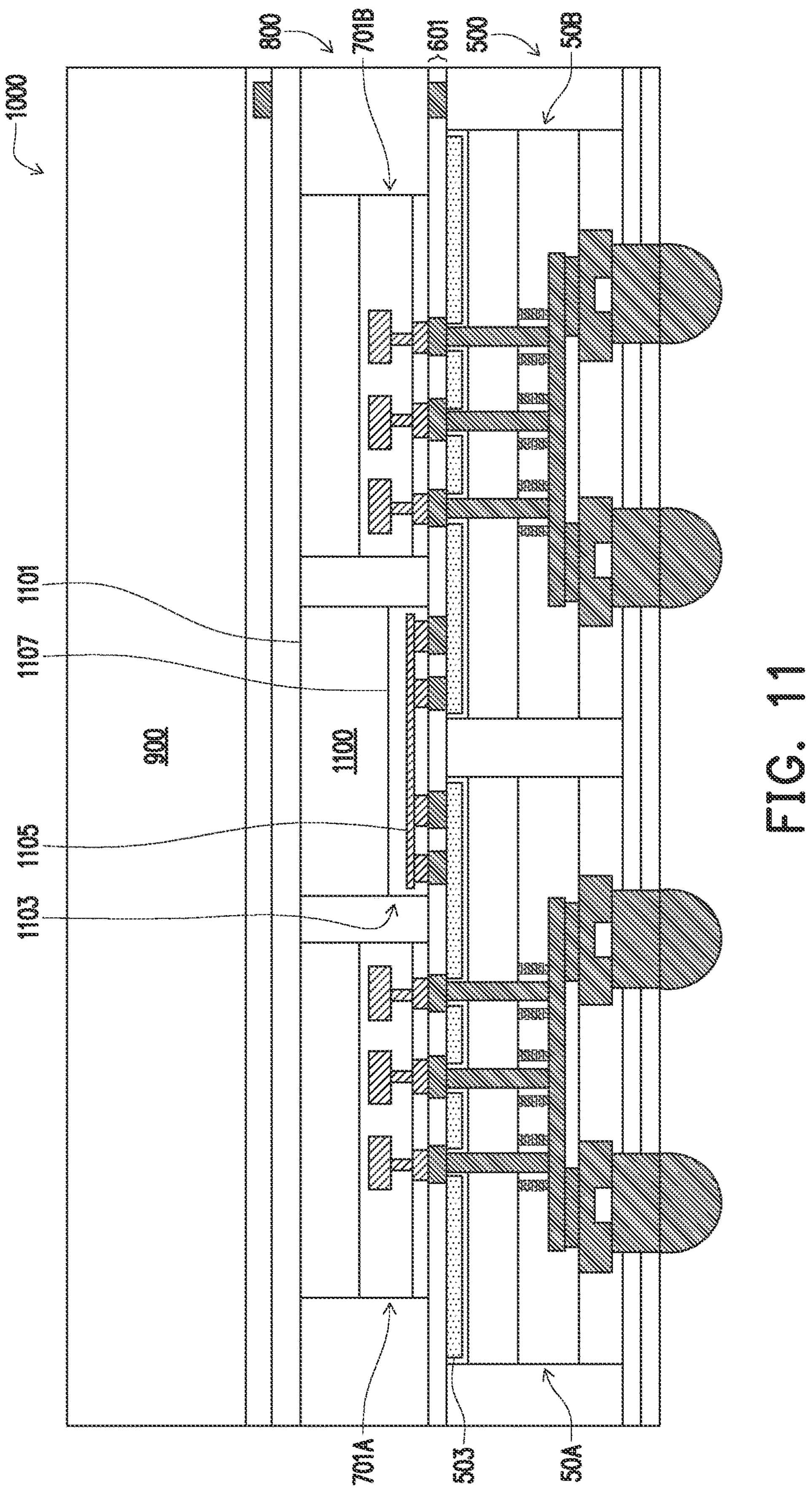
FIG. 11 illustrates a view of the first POP device with a local interconnect bridge connecting multiple bottom semiconductor dies in accordance with some embodiments.

FIG. 11 illustrates a cross-sectional view of an alternative embodiment of the first PoP device 1000 in which the first package device 500 comprises multiple first integrated circuit dies 50 (e.g., a first semiconductor die 50A and a second semiconductor die 50B) electrically coupled by a local interconnect 1100 (also referred to as a Si-Bridge). In this embodiment, the first package device 500 is formed in the same or similar manner as discussed above, including the formation of the thermal expansion resistant layer 503 associated with each of the first integrated circuit dies 50 but with the first semiconductor die 50A and the second semiconductor die 50B illustrated. The second package device 800 is formed in the same or similar manner as discussed above but with multiple of the second integrated circuit dies 701 illustrated (e.g., a third semiconductor die 701A and a fourth semiconductor die 701B). In an embodiment, the first semiconductor die 50A is bonded and electrically coupled to the third semiconductor die 701A and the second semiconductor die 50B is bonded and electrically coupled to the fourth semiconductor die 701B in a similar manner as discussed above with respect to the first integrated circuit die 50 being bonded and electrically coupled to the second integrated circuit die 701. It should be noted that while not separately illustrated, the dummy dies 703 may or may not be present in the second device package 800.

In this embodiment, the local interconnect 1100 comprises an interconnect substrate 1101 that supports a second interconnect structure 1103, which comprises second metallization patterns 1105 (e.g., conductive lines, vias, and conductive pads) in one or more second interconnect dielectric layers 1107. The second metallization patterns 1105 and the second interconnect dielectric layers 1107 may be formed in a similar manner and form similar materials as discussed with respect to the first metallization patterns 55 and the first interconnect dielectric layer 57. In an embodiment, the interconnect substrate 1101 may be formed of silicon, such as bulk silicon. In an embodiment, the interconnect substrate 1101 may be formed in a similar manner and from similar materials as the first semiconductor substrate 51. The conductive pads of the second metallization patterns 1105 along with one of the second interconnect dielectric layers 1107 may be used to bond the local interconnect structure 1100 to the third bonding layer 601 within the second package device 800 in a similar manner as discussed with respect to the bonding of the fourth bonding layer 709 to the third bonding layer 601.

It should be noted that other features and processes discussed above with respect to the formation of the first POP device 1000 are intended to be represented in the embodiment illustrated in FIG. 11 and may be formed in a similar manner and from similar materials as discussed above with respect to the formation of the first POP device 1000.

Figure 12:
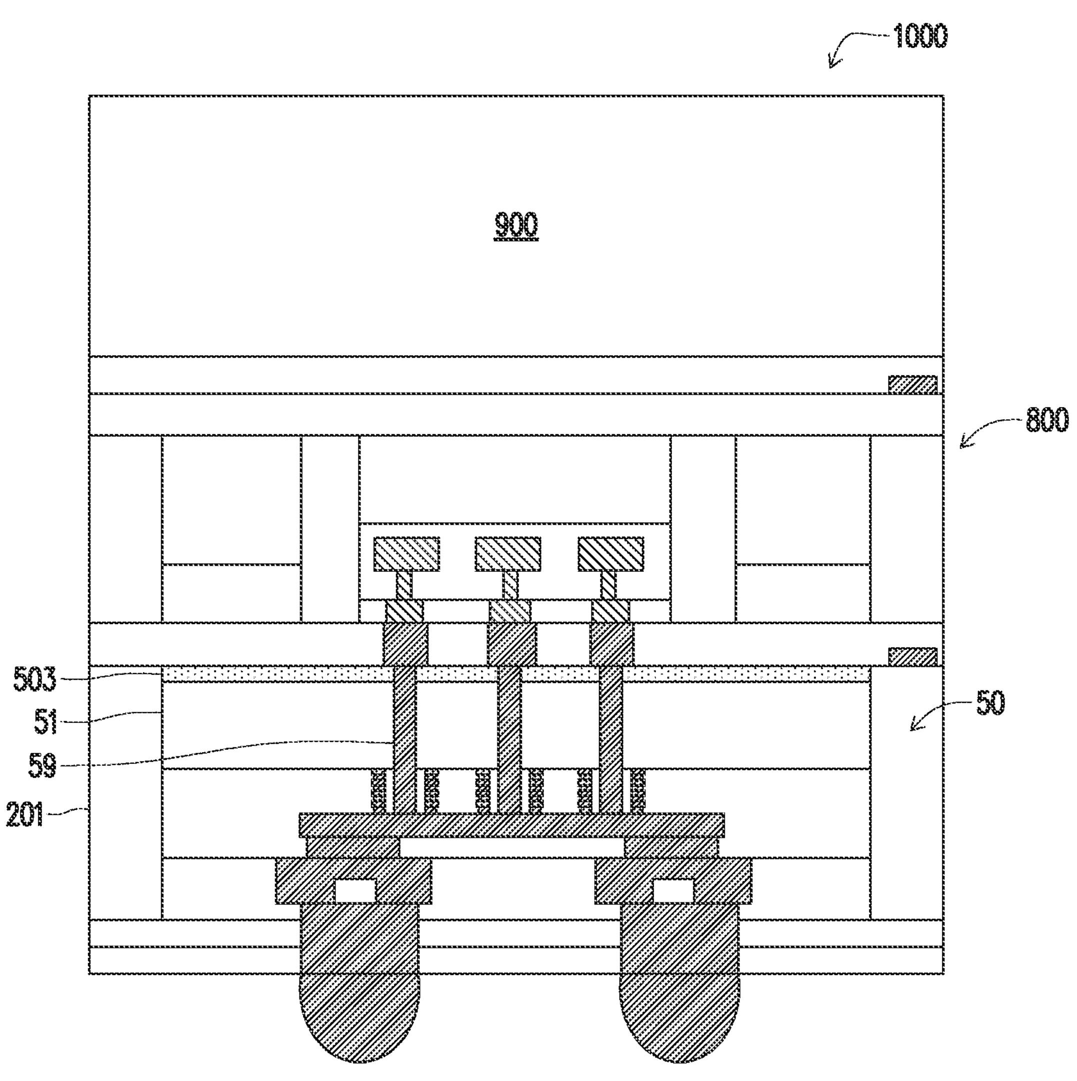
FIG. 12 illustrates a view of the first POP device with the thermal expansion resistant layer directly over the top surface of the bottom semiconductor die in accordance with some embodiments.

FIG. 12 illustrates a cross-sectional view of an alternative embodiment of the first PoP device 1000 in which during the formation of the first package device 800 the oxide liner 501 is omitted. In this embodiment, following the formation of the recesses 303 in the first integrated circuit die 50, the thermal expansion resistant material 403 is deposited in a similar manner as discussed above but without first depositing the oxide material 401 such that the thermal expansion resistant material 403 is deposited directly over the first insulating material 201, over the exposed surfaces of the first semiconductor substrate 51, and over the exposed surfaces of the TSVs 59. In this embodiment, following the planarization process 505, the thermal expansion resistant layer 503 is in direct physical contact with the first insulating material 201, the first semiconductor substrate 51, and sidewalls of the TSVs 59.

It should be noted that other features and processes discussed above with respect to the formation of the first POP device 1000 are intended to be represented in the embodiment illustrated in FIG. 12 and may be formed in a similar manner and from similar materials as discussed above with respect to the formation of the first POP device 1000.

Figure 13:
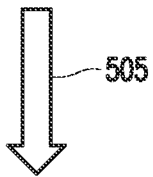
FIGS. 13-16 illustrate various views in forming a second POP device having a thermal expansion resistant layer over a top surface of a bottom device package in accordance with some embodiments.
Figure 13:
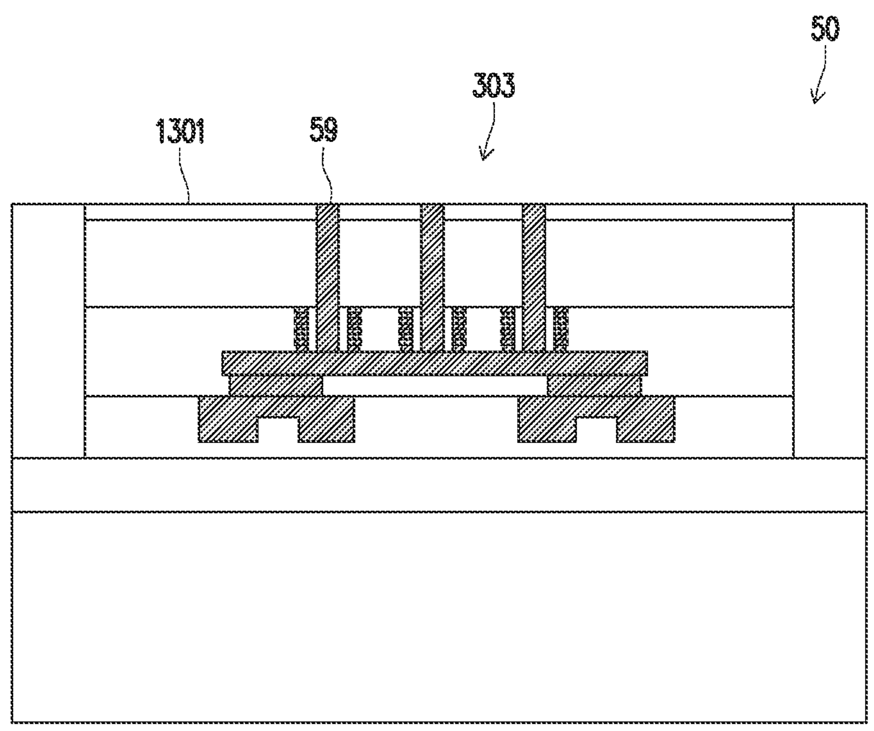

FIG. 13 illustrates a cross-sectional view of the first integrated circuit die 50 in which the oxide material 401 is deposited to fully fill the recesses 303. In this embodiment, following the formation of the recesses 303, the oxide material 401 is deposited in a similar manner as discussed above but fully fills the recesses 303. The planarization process 505 may then be performed to expose the TSVs 59 through the oxide material 401 and form an oxide layer 1301 from the oxide material 401 in the recess 303. In this embodiment, the first insulating material 201, the oxide layer 1301 and the TSVs 59 share a planar top surface (within process variations).

Figure 14:
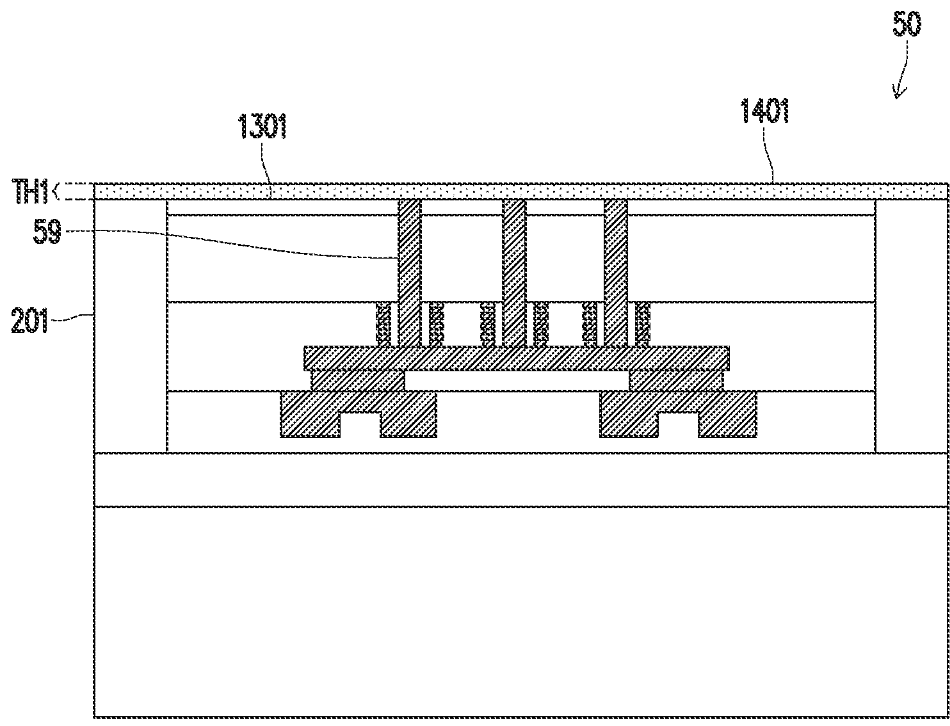

FIG. 14 illustrates a cross-sectional view of a formation of a second thermal expansion resistant layer 1401 over the planar top surface of the first insulating material 201, the oxide layer 1301, and the TSVs 59. In this embodiment, the second thermal expansion resistant layer 1401 may be deposited in a similar manner and from similar materials as the thermal expansion resistant material 403 but extends over the top surface of the TSVs 59 and over the top surface of the first insulating material 201 rather than between the TSVs 59 and between the first insulating material 201. In this embodiment, the second thermal expansion resistant layer 1401 may have the first thickness TH1 and the first hardness. If the second thermal expansion resistant layer 1401 does not have the first thickness TH1 or the first hardness, than the overall structure may experience the same consequences as discussed with respect to the first thickness TH1 and the first hardness of the thermal expansion resistant layer 503.

Figure 15:
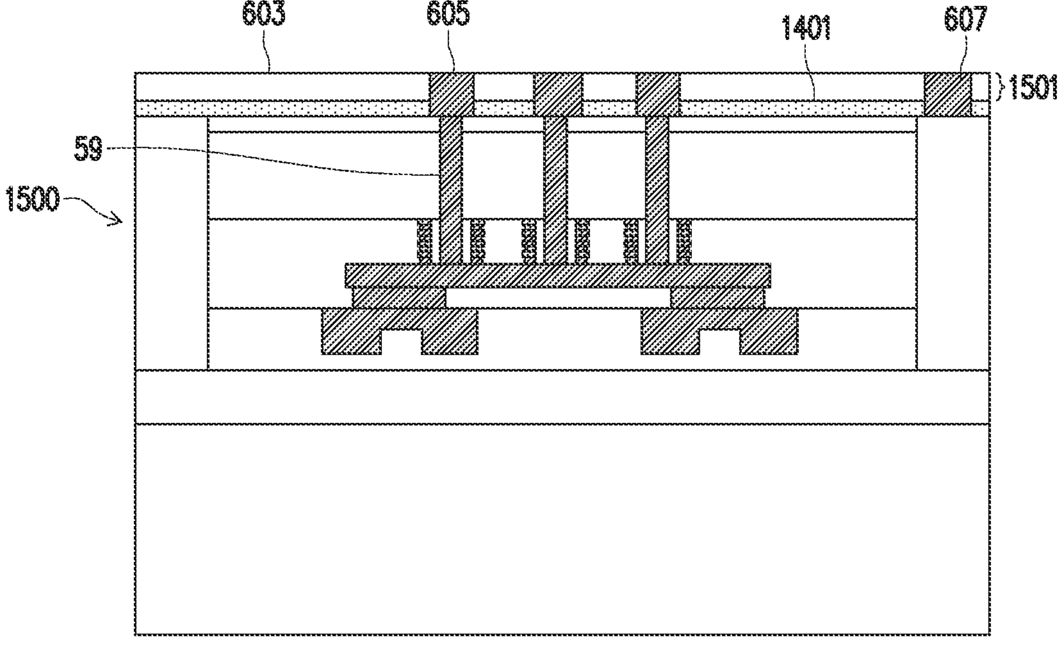

FIG. 15 illustrates a cross-sectional view of a formation of a seventh bonding layer 1501 over the second thermal expansion resistant layer 1401. In this embodiment, the seventh bonding layer 1501 may be formed in a similar manner and from similar materials as the third bonding layer 601, with the exception that during the formation of the first bond pads 605, the first bond pads 605 extend through the first dielectric layer 603 and through the second thermal expansion layer 1401 to physically and electrically couple to the TSVs 59. Additionally, the first alignment structure 607 may also extend through the first dielectric layer 603 and through the second thermal expansion layer 1401 in this embodiment. The resulting structure illustrated in FIG. 15 may be referred to as a third package device 1500.

Figure 16:
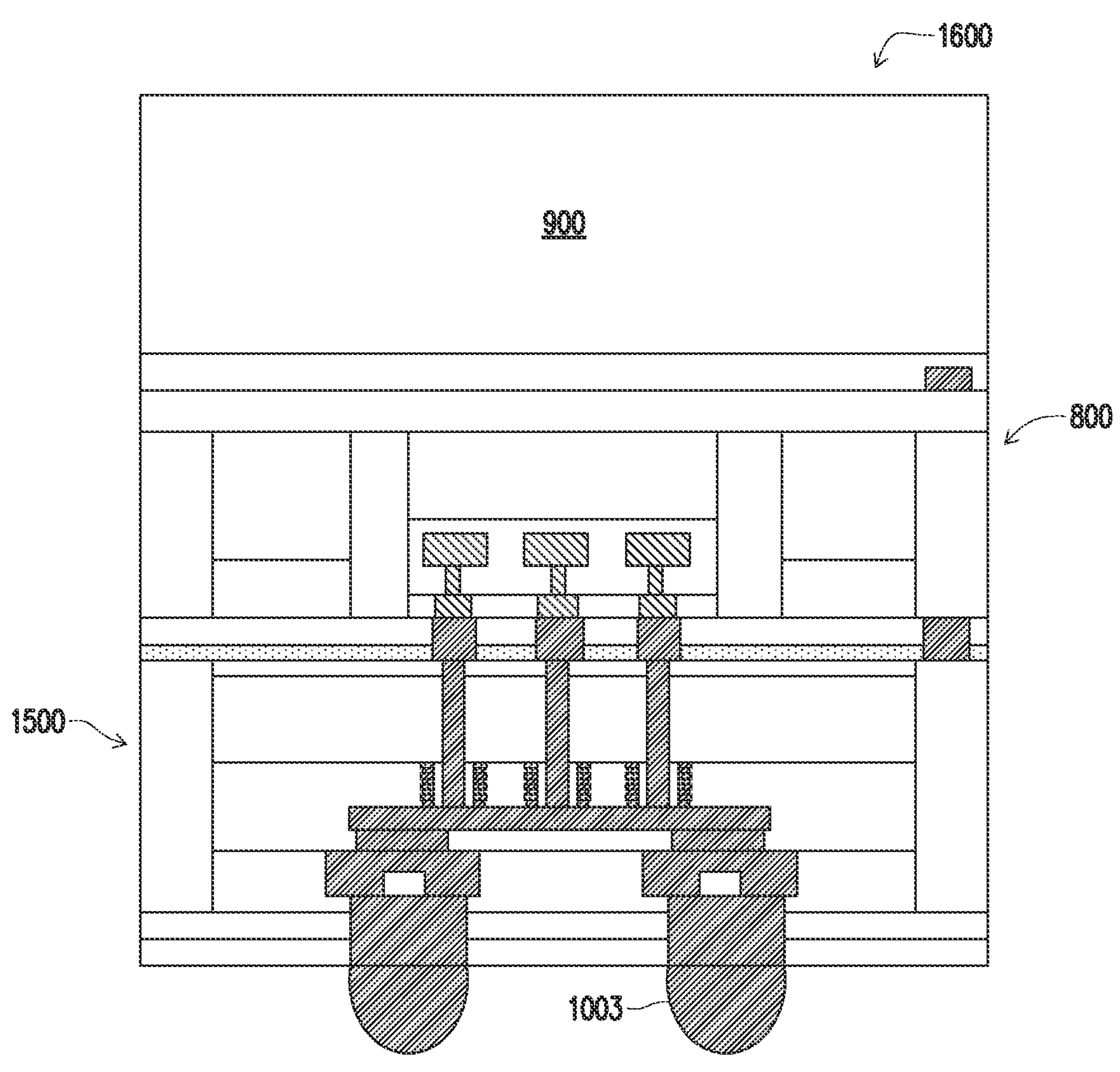

FIG. 16 illustrates a cross-sectional view of a second POP device 1600 comprising of the third package device 1500, the second package device 800, the second carrier substrate 900, and the conductive connectors 1003. It should be noted that other features and processes discussed above with respect to the formation of the first POP device 1000 are intended to be represented in the embodiment illustrated in FIG. 16 and may be formed in a similar manner and from similar materials as discussed above with respect to the formation of the first POP device 1000 when forming the second PoP device 1600.

Figure 17:
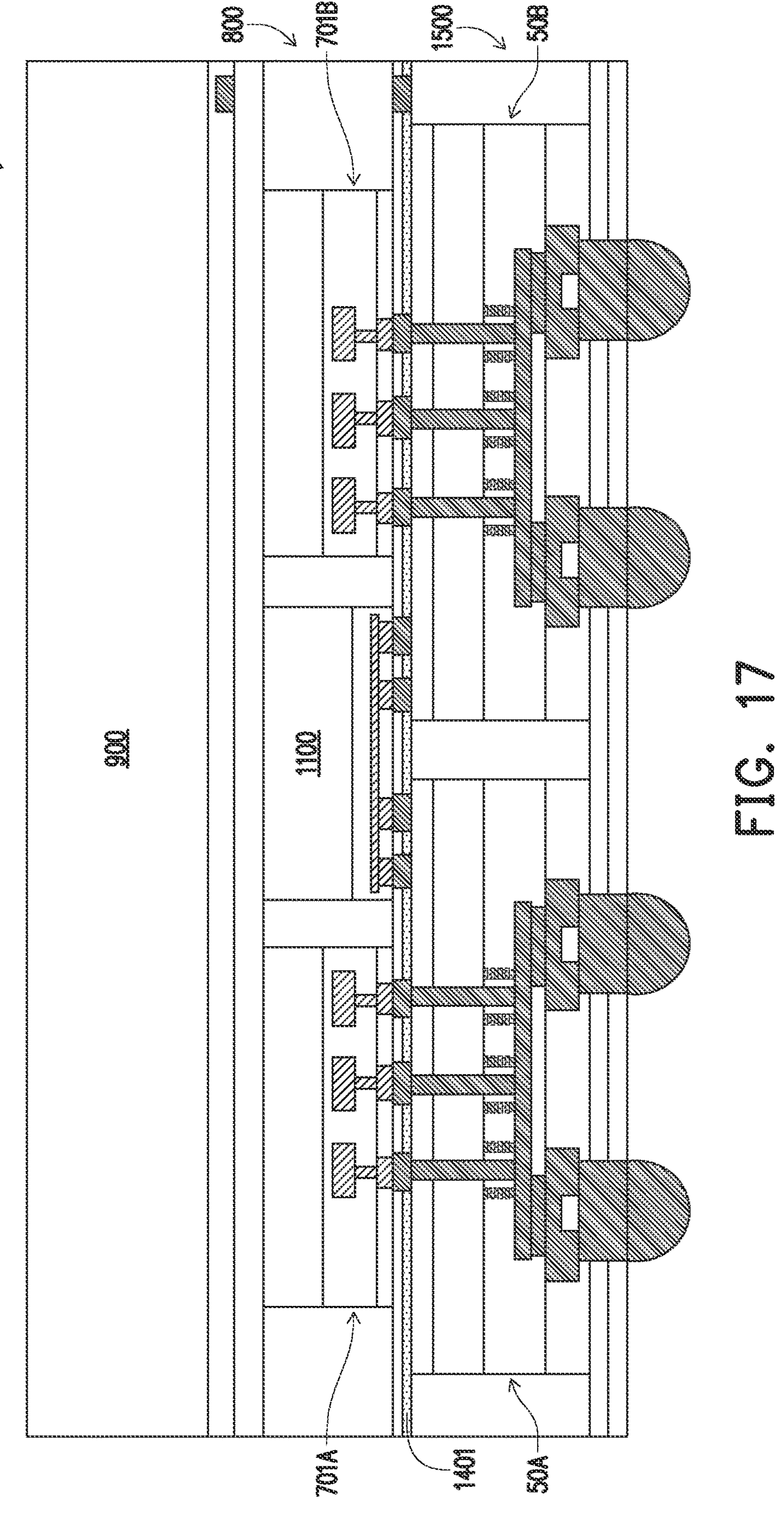
FIG. 17 illustrates a view of the second POP device with a local interconnect bridge connecting multiple bottom semiconductor dies in accordance with some embodiments.

FIG. 17 illustrates a cross-sectional view of an alternative embodiment of the second PoP device 1600 in which the third package device 1500 comprises multiple first integrated circuit dies 50 (e.g., the first semiconductor die 50A and the second semiconductor die 50B) electrically coupled by the local interconnect 1100. In this embodiment, the third package device 1500 is formed in the same or similar manner as discussed above, including the formation of the second thermal expansion resistant layer 1401 associated with each of the first integrated circuit dies 50 but with the first semiconductor die 50A and the second semiconductor die 50B illustrated. The second package device 800 is formed in the same or similar manner as discussed above but with multiple of the second integrated circuit dies 701 illustrated (e.g., the third semiconductor die 701A and the fourth semiconductor die 701B). In an embodiment, the first semiconductor die 50A is bonded and electrically coupled to the third semiconductor die 701A and the second semiconductor die 50B is bonded and electrically coupled to the fourth semiconductor die 701B in a similar manner as discussed above with respect to the first integrated circuit die 50 being bonded and electrically coupled to the second integrated circuit die 701. It should be noted that while not separately illustrated, the dummy dies 703 may or may not be present in the second device package 800. The local interconnect 1100 may be formed in the same or similar manner and from the same or similar materials as discussed above.

It should be noted that other features and processes discussed above with respect to the formation of the first POP device 1000 are intended to be represented in the embodiment illustrated in FIG. 17 and may be formed in a similar manner and from similar materials as discussed above with respect to the formation of the first POP device 1000 when forming the second POP device 1600.

Figure 18:
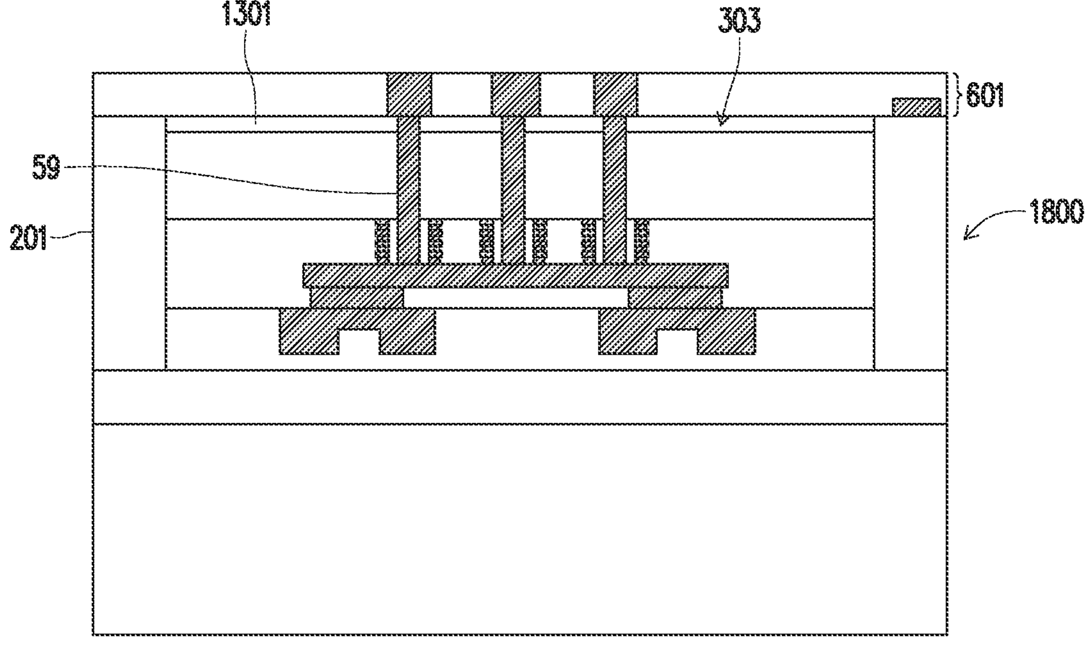
FIGS. 18-20 illustrate various views in forming a third POP device having a thermal expansion resistant layer between a top device package and a carrier substrate in accordance with some embodiments.

FIG. 18 illustrates a cross-sectional view of the oxide layer 1301 formed in the recesses 303 over the first integrated circuit die 50 and the formation of the third bonding layer 601 directly over the oxide layer 1301. In this embodiment, following the formation of the oxide layer 1301, the formation of the second thermal expansion resistant layer 1401 is omitted and the third bonding layer 601 is formed directly over the oxide layer 1301 as well as over the top surface of the first insulating material 201. The structure illustrated in FIG. 18 may be referred to as a fourth package device 1800.

Figure 19:
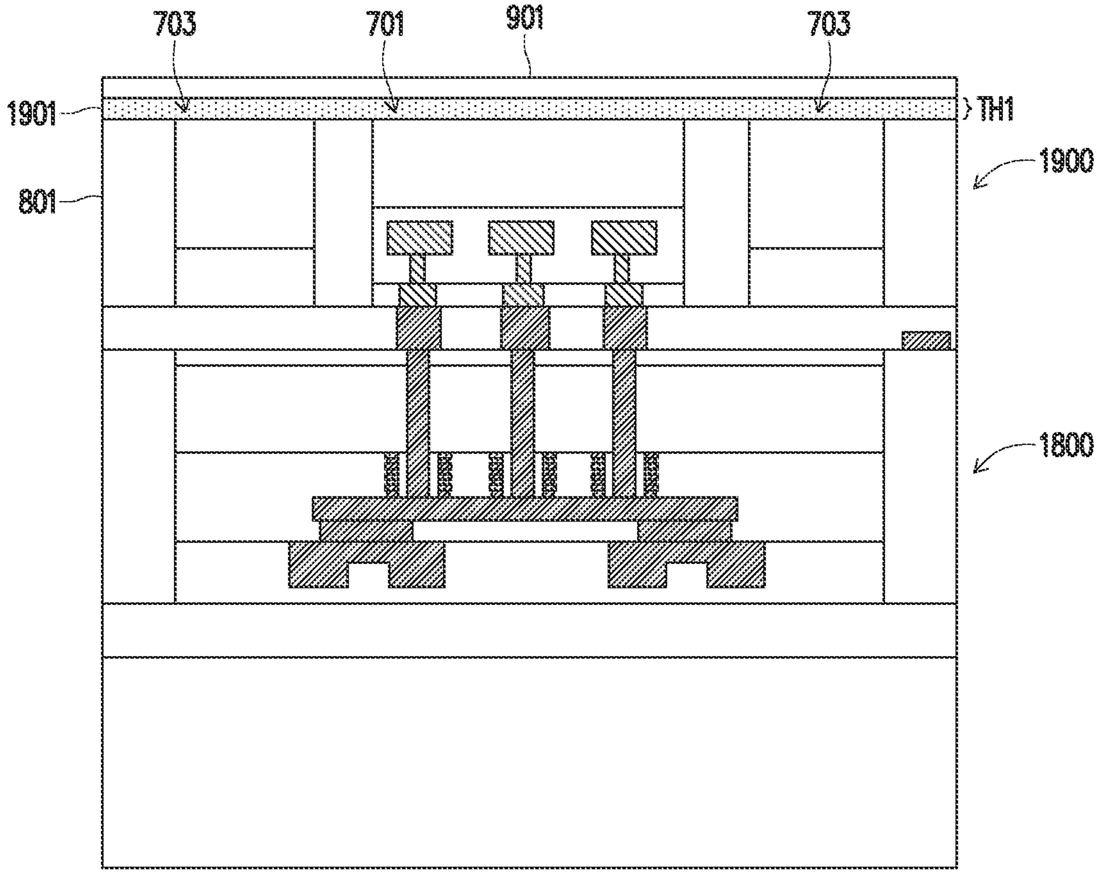

FIG. 19 illustrates a cross-sectional view of a formation of a fifth package device 1900 over the fourth package device 1800. In an embodiment, the fifth package device 1900 comprises the second integrated circuit die 701 and the dummy dies 703, and the second insulating material 801 encapsulating both the second integrated circuit die 701 and the dummy dies 703, along with a third thermal expansion resistant layer 1901 and the fifth bonding layer 901. The second integrated circuit die 701 and the dummy dies 703 may be bonded to the third bonding layer 601 in a similar manner as discussed above with respect to the bonding of the dummy dies 703 to the third bonding layer 601 and the bonding of the second integrated circuit die 701 to the third bonding layer 601 In some embodiments, the second insulating material 801 may be thinned in a similar manner as the first insulating material 201 such that the one or more dummy dies 703, the second integrated circuit die 701, and the second insulating material 801 share a planar top surface (within process variations). Following the thinning of the second insulating material 801, the third thermal expansion resistant layer 1901 may be formed over the planar top surface. In an embodiment, the third thermal expansion resistant layer 1901 may be formed in a similar manner and from similar materials as discussed with respect to the second thermal expansion resistant layer 1401. In an embodiment, the third thermal expansion resistant layer 1901 may be formed to the first thickness Th1 and have the first hardness. If the third thermal expansion resistant layer 1901 does not have the first thickness TH1 or the first hardness, than the overall structure may experience the same consequences as discussed with respect to the first thickness TH1 and the first hardness of the thermal expansion resistant layer 503. Following the formation of the third thermal expansion resistant layer 1901, the fifth bonding layer 901 may be formed over the third thermal expansion resistant layer 1901.

Figure 20:
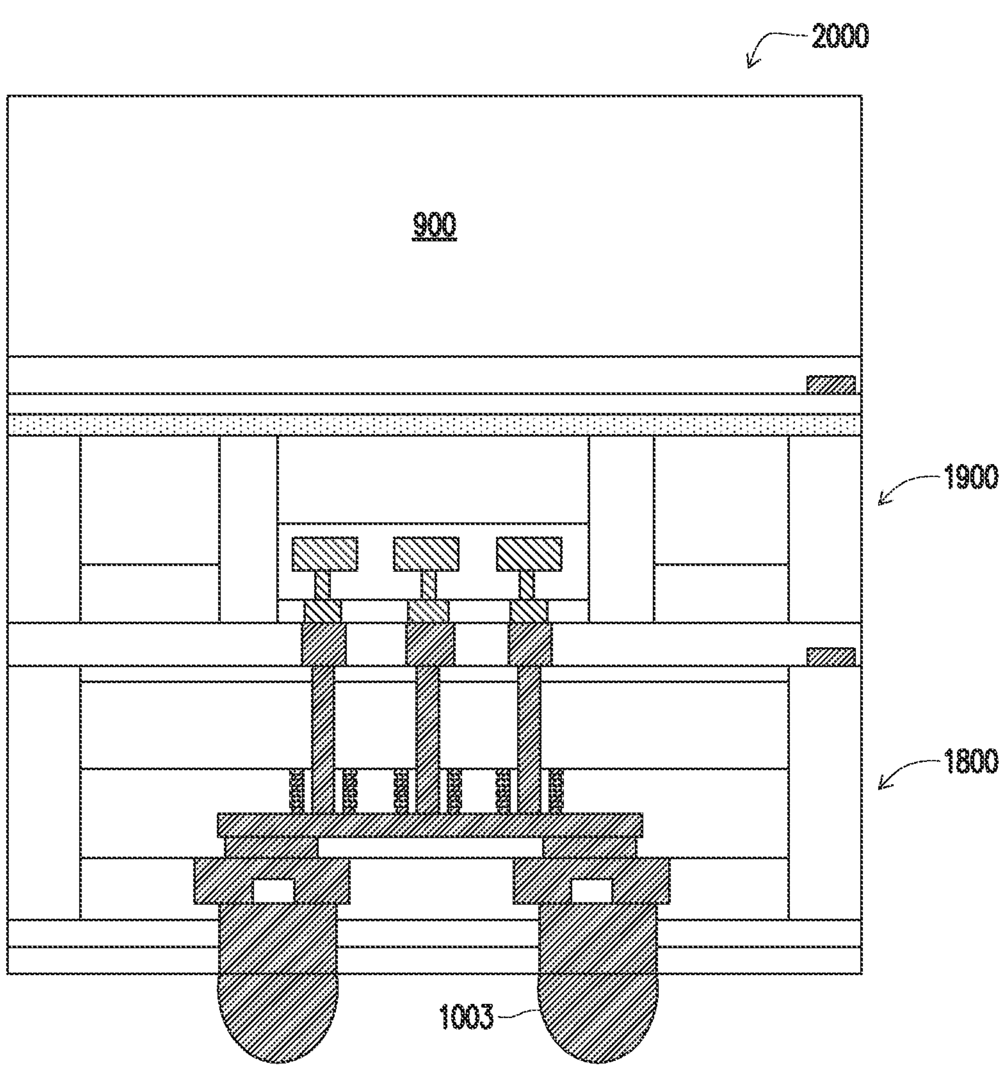

FIG. 20 illustrates a cross-sectional view of a third POP device 2000 comprising of the fourth package device 1800, the fifth package device 1900, the second carrier substrate 900, and the conductive connectors 1003. It should be noted that other features and processes discussed above with respect to the formation of the first POP device 1000 are intended to be represented in the embodiment illustrated in FIG. 20 and may be formed in a similar manner and from similar materials as discussed above with respect to the formation of the first POP device 1000 when forming the third PoP device 2000. Additionally, it should be noted that the third POP device 2000 may also comprise multiple first integrated circuit dies 50 (not separately illustrated), multiple second integrated circuit dies 701 (not separately illustrated), and the local interconnect 1100 in a similar manner as discussed above in representative embodiments illustrated in FIGS. 11 and 17.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments may achieve advantages. In accordance with some embodiments the use of a thermal expansion resistant material (e.g., silicon nitride) as used in the thermal expansion resistant layer 503, the second thermal expansion resistant layer 1401, and the third thermal expansion resistant layer 1901 reduces the risk of delamination within the first POP device 1000, the second POP device 1600, and the third PoP device 2000 by suppressing punch up caused by thermal mismatch within the POP devices that may result in delamination at boundary layers (e.g., between the third bonding layer 601 and the fourth bonding layer 709). By utilizing the thermal expansion resistant layer within the POP devices the reliability of the POP devices may be improved which may additionally help reduce the overall cost of manufacturing the POP devices.

In accordance with some embodiments, a device includes a first semiconductor package including a first semiconductor die encapsulated in an insulating material, a first thermal expansion resistant layer over the first semiconductor die, a bonding layer over the first thermal expansion resistant layer and the insulating material, and a second semiconductor die directly bonded to the bonding layer. In an embodiment, the first thermal expansion resistant layer extends over a top surface of the insulating material. In an embodiment, the insulating material encapsulates both the first semiconductor package and the first thermal expansion resistant layer. In an embodiment, the first thermal expansion resistant layer has a thickness in a range of 500 Å to 10,000 Å. In an embodiment, the first thermal expansion resistant layer comprises silicon nitride. In an embodiment, further including a third semiconductor die adjacent to the first semiconductor die, wherein the first thermal expansion resistant layer extends over the third semiconductor die. In an embodiment, further including a third semiconductor die adjacent to the first semiconductor die, wherein the bonding layer extends over the third semiconductor die, and wherein a second thermal expansion resistant layer is disposed between the third semiconductor die and the bonding layer. In an embodiment, further including a third semiconductor die adjacent to the first semiconductor die, and a local silicon interconnect adjacent to the second semiconductor die, the local silicon interconnect electrically coupling the first semiconductor die to the third semiconductor die.

In accordance with some embodiments, a method of manufacturing a semiconductor device includes depositing a thermal resistant layer over a first semiconductor die, forming a bonding layer over the thermal resistant layer opposite the first semiconductor die, and bonding a second semiconductor die to the bonding layer with dielectric-to-dielectric and metal-to-metal bonding, wherein the bonding the second semiconductor die to the bonding layer electrically couples the first semiconductor die to the second semiconductor die. In an embodiment, the forming the thermal resistant layer has a hardness in a range of 10 GPa to 30 GPa. In an embodiment, further including forming an oxide liner around the thermal resistant layer. In an embodiment, the thermal resistant layer extends over a third semiconductor die, the third semiconductor die being adjacent to the first semiconductor die. In an embodiment, the forming the bonding layer includes forming bonding pads embedded within the bonding layer, the bonding pads being in contact with a top surface of the thermal resistant layer. In an embodiment, the forming the bonding layer includes forming bonding pads in the bonding layer and extending into the thermal resistant layer.

In accordance with some embodiments, a device includes a first semiconductor die embedded in a first insulating layer, a second semiconductor die adjacent to the first semiconductor die embedded in the first insulating layer, a first nitride layer over the first semiconductor die, a bonding layer over the first nitride layer opposite the first semiconductor die, and a third semiconductor die bonded to the bonding layer opposite the first semiconductor die. In an embodiment, the first nitride layer extends over the second semiconductor die. In an embodiment, further including a second nitride layer over the second semiconductor die, wherein the second nitride layer is disposed between the second semiconductor die and the bonding layer. In an embodiment, further including a silicon bridge bonded to the bonding layer, the silicon bridge electrically coupling the first semiconductor die to the second semiconductor die. In an embodiment, further including dummy dies bonded to the bonding layer opposite the first semiconductor die. In an embodiment, further including conductive bonding pads extending through both the bonding layer and the first nitride layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:

a first semiconductor package comprising a first semiconductor die encapsulated in an insulating material;

a first thermal expansion resistant layer over the first semiconductor die;

a bonding layer over the first thermal expansion resistant layer and the insulating material;

an oxide liner extending between the first semiconductor die and the first thermal expansion resistant layer; and a second semiconductor die directly bonded to the bonding layer.

2. The device of claim 1, wherein the first thermal expansion resistant layer extends over a top surface of the insulating material.

3. The device of claim 1, wherein the insulating material encapsulates both the first semiconductor package and the first thermal expansion resistant layer.

4. The device of claim 1, wherein the first thermal expansion resistant layer has a thickness in a range of 500 Å to 10,000 Å.

5. The device of claim 1, wherein the first thermal expansion resistant layer comprises silicon nitride.

6. The device of claim 1, further comprising a third semiconductor die adjacent to the first semiconductor die, wherein the first thermal expansion resistant layer extends over the third semiconductor die.

7. The device of claim 1, further comprising a third semiconductor die adjacent to the first semiconductor die, wherein the bonding layer extends over the third semiconductor die, and wherein a second thermal expansion resistant layer is disposed between the third semiconductor die and the bonding layer.

8. The device of claim 1, further comprising:

a third semiconductor die adjacent to the first semiconductor die; and a local silicon interconnect adjacent to the second semiconductor die, the local silicon interconnect electrically coupling the first semiconductor die to the third semiconductor die.

9. A method of manufacturing a semiconductor device, the method comprising:

forming over a first semiconductor die an oxide liner, the oxide liner defining a cavity therein;

depositing a thermal resistant layer within the cavity, and over the first semiconductor die;

forming a bonding layer over the thermal resistant layer opposite the first semiconductor die; and bonding a second semiconductor die to the bonding layer with dielectric-to-dielectric and metal-to-metal bonding, wherein the bonding the second semiconductor die to the bonding layer electrically couples the first semiconductor die to the second semiconductor die.

10. The method of claim 9, wherein the forming the thermal resistant layer has a hardness in a range of 10 GPa to 30 GPa.

11. The method of claim 9, further comprising forming an electrical contact extending through the thermal resistant layer, wherein the oxide liner separates the thermal resistant layer from the electrical contact.

12. The method of claim 9, wherein the thermal resistant layer extends over a third semiconductor die, the third semiconductor die being adjacent to the first semiconductor die.

13. The method of claim 9, wherein the forming the bonding layer comprises forming bonding pads embedded within the bonding layer, the bonding pads being in contact with a top surface of the thermal resistant layer.

14. The method of claim 9, wherein the forming the bonding layer comprises forming bonding pads in the bonding layer and extending into the thermal resistant layer.

15. A device comprising:

a first semiconductor die embedded in a first insulating layer;

a second semiconductor die adjacent to the first semiconductor die embedded in the first insulating layer;

a first nitride layer over the first semiconductor die;

a bonding layer over the first nitride layer opposite the first semiconductor die; and a third semiconductor die bonded to the bonding layer opposite the first semiconductor die; and a silicon bridge bonded to the bonding layer, the silicon bridge electrically coupling the first semiconductor die to the second semiconductor die.

16. The device of claim 15, wherein the first nitride layer extends over the second semiconductor die.

17. The device of claim 15, further comprising a second nitride layer over the second semiconductor die, wherein the second nitride layer is disposed between the second semiconductor die and the bonding layer.

18. The device of claim 15, further comprising an oxide liner surrounding the first nitride layer on at least four sides thereof.

19. The device of claim 18, further comprising dummy dies bonded to the bonding layer opposite the first semiconductor die.

20. The device of claim 15, further comprising conductive bonding pads extending through both the bonding layer and the first nitride layer.

* * * * *